United States Patent [19]

Rocci et al.

[11] Patent Number: 4,797,604

[45] Date of Patent: Jan. 10, 1989

[54] WIRE LENGTH METER SUPPLING CURRENT TO A WIRE FROM WHICH A SIGNAL REPRESENTATIVE OF LENGTH IS DERIVED

[75] Inventors: Joseph A. Rocci, Palos Heights; John Crosetto, Bridgeview; Kent L. Earle, Woodridge; David W. Kirby, Palos Heights, all of Ill.

[73] Assignee: Etcon Corporation

[21] Appl. No.: 130,417

[22] Filed: Dec. 9, 1987

[51] Int. Cl.[4] .............................................. G01R 27/02
[52] U.S. Cl. ..................................... 324/65 R; 324/62
[58] Field of Search ................... 324/62, 65 R, 73 AT; 364/562; 148/11.5 Q

[56] References Cited

U.S. PATENT DOCUMENTS

| | | | |
|---|---|---|---|
| 3,871,359 | 3/1975 | Pacela | 324/65 R |
| 3,974,443 | 8/1976 | Thomas | 324/65 R |
| 4,055,801 | 10/1977 | Pike et al. | 324/73 AT |

Primary Examiner—Gerard R. Strecker
Assistant Examiner—Maura K. Regan
Attorney, Agent, or Firm—Pigott & Gerstman, Ltd.

[57] ABSTRACT

An apparatus for determining the length of wires includes connector assemblies, a current source circuit, a voltage gain circuit, analog-to-digital converter, a read-only memory, a microprocessor and a display unit. The connector assemblies are connected across the ends of the wire whose length is to be determined. The current source circuit is used to selectively supply different values of currents to the wire whose length is to be determined. The voltage gain circuit is responsive to the different values of currents for selectively generating a plurality of different voltage levels for each of the different values of currents so as to provide an analog voltage signal having a predetermined range. The analog-to-digital converter is responsive to the analog voltage signal for converting the same to a first digital signal corresponding to a resistance of the wire. The read-only memory is used to store data representative of resistance per unit length of various sizes of wires having a uniform cross-sectional area and for storing programmed instructions. The microprocessor utilizes the first digital signal corresponding to the resistance of the wire and the stored data representative of resistance per unit area for generating a second digital signal representative of the length of the wire. The display unit is responsive to the second digital signal for indicating the wire length.

20 Claims, 6 Drawing Sheets

WIRE LENGTH METER SUPPLING CURRENT TO A WIRE FROM WHICH A SIGNAL REPRESENTATIVE OF LENGTH IS DERIVED

BACKGROUND OF THE INVENTION

This invention relates generally to electrical measurement devices and more particularly, it relates to a method and apparatus for determining the length of wires wound on a reel and the like on an effective and efficient basis.

As is well known, wires or cables are typically wound on a core or reel for storage and use. These wires or cables may be stranded or solid which vary in diameter from 24 AWG to 1000 MCM and in length from 15 feet to 20,000 feet. In use, certain lengths of wire are unreeled from the core and then cut as needed. One of the difficulties encountered heretofore by consumers of such wires or cables is to quickly determine their remaining inventories of these various wires. One way is to physically unwind each of the cores of wires or cables and measure the length thereof. Even if this was possible in each instance, it would be quite difficult and expensive as well as time-consuming, thereby increasing substantially the labor costs.

It would therefore be desirable to provide a wire length meter like that of the present invention which can measure quickly and display the wire length of a wide range of wires while they are still wound on a reel. The apparatus for determining the length of wires of the present invention is a portable unit which can be hand carried, has its own power supply source, and can be readily operated without requiring special skills on the part of the user.

SUMMARY OF THE INVENTION

Accordingly, it is a general object of the present invention to provide a method and an apparatus for determining the length of wires wound on a reel which is relatively simple and economical to manufacture and assemble.

It is another object of the present invention to provide an apparatus for determining the length of wires wound on a reel which is of a rugged construction and can be operated without any special skills on the part of the user.

It is another object of the present invention to provide a wire length meter which includes a selectable current source circuit, a selectable voltage gain circuit, an analog-to-digital converter, a microprocessor, a read-only memory and a display unit for measuring quickly and displaying the length of a wire.

It is still another object of the present invention to provide a wire length meter which includes a temperature compensation network to provide automatic adjustment for ambient temperatures, thereby increasing its accuracy and reliability.

It is yet still another object of the present invention to provide a wire length meter which includes a calibration mode of operation so as to enable measurement of non-standard gauge wires.

In accordance with these aims and objectives, the present invention is concerned with the provision of a method and an apparatus for determining the length of wires in which the apparatus includes connector assemblies for connecting across the ends of the wire whose length is to be determined, a current source circuit, a voltage gain circuit, an analog-to-digital converter, a read-only memory, a digital processor, and a display unit. The current source circuit is used to selectively supply different values of currents through the wire whose length is to be determined. The voltage gain circuit is responsive to the different values of currents and selectively generates a plurality of different voltage levels for each of the different values of currents so as to provide an analog voltage signal having a predetermined range. The analog-to-digital converter is responsive to the analog voltage signal for converting the same to a first digital signal corresponding to a resistance of the wire.

The read-only memory is used to store data representative of resistance per unit area of various sizes of wire having a uniform cross-sectional area and to store programmed instructions. The digital processor is responsive to the program instructions stored in the read-only memory for controlling the operation of the current source circuit, the voltage gain circuit, and the analog-to-digital converter so as to generate the first digital signal corresponding to the resistance of the wire. The digital processor utilizes the digital signal corresponding to the resistance of the wire and the data representative of the resistance per unit length for generating a second digital signal representative of the length of the wire. The display unit is responsive to the second digital signal for indicating the wire length.

BRIEF DESCRIPTION OF THE DRAWINGS

These and other objects of the present invention will become more fully apparent from the following detailed description when read in conjunction with the accompanying drawings with like reference numerals indicating corresponding parts throughout, wherein.

DESCRIPTION OF THE PREFERRED EMBODIMENT

Figure 1:
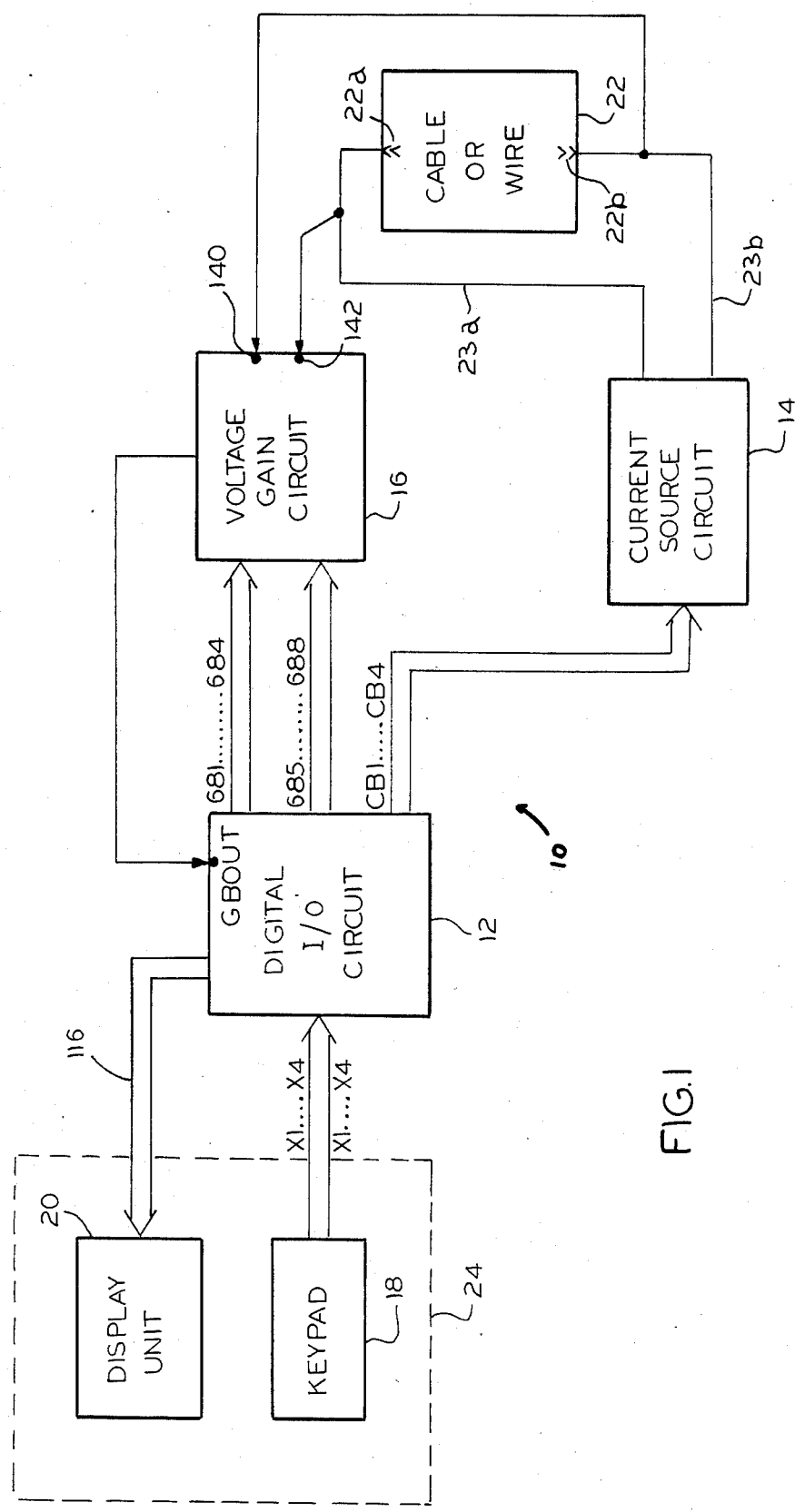
FIG. 1 is a simplified block diagram of an apparatus for determining the length of wires constructed in accordance with the principles of the present invention.

Referring now in detail to the drawings, there is shown in FIG. 1 a simplified block diagram of an apparatus 10 for determining the length of wires or cables, constructed in accordance with the present invention. The apparatus 10 is a wire length meter and includes a digital input/output (I/O) circuit portion 12, a selectable current source circuit portion 14, a selectable voltage gain circuit portion 16, a keyboard portion 18, and a display unit or portion 20. A reel of wire or cable sample 22 whose length is to be determined has its ends 22a, 22b thereof connected via respective connector assemblies 23a, 23b to the current source circuit portion 14. The current source circuit portion 14, voltage gain circuit portion 16, and display portion are controlled by the microprocessor-based digital I/O circuit portion 12 which directs specific values of current from the current source circuit portion 14 to be passed through the wire sample 22.

With the current source circuit portion 14 selectively supplying different values of current through the wire whose length is to be determined, the voltage gain circuit portion 16 is used to measure the voltage across the ends of the wire so as to selectively generate a plurality of different voltage levels for each of the different values of current.

Since both the current passing through the wire sample and the voltage across the ends of the wire sample are known, it is easy to establish an equation based upon Ohm's Law for determining the value of the resistance R of the wire:

$$R = V/I \qquad (1)$$

where:
V is the measured voltage across the ends of the wire sample
I is the current passed through the wire sample.

It is also generally known that the resistance R of a conductive material can be expressed mathematically as follows:

$$R = \frac{L}{\sigma A} \qquad (2)$$

where:
L is the length of the conductive material
A is the cross-sectional area of the material
$\sigma$ is the conductance of the material.

By inserting equation (2) into equation (1) and solving for the length L, there is given:

$$L = \frac{VA\sigma}{I} = \frac{VA}{I}\left(\frac{1}{\rho}\right) \qquad (3)$$

where:
$\rho = 1/\sigma$ = resistivity.

Further, it is known that resistivity is a function of temperatures of the material and can be expressed mathematically as follows:

$$\rho = \rho_{20}[1 + \alpha(t_A - 20)] \qquad (4)$$

where:
$\rho_{20}$ is the resistivity of the material at 20° C.
$\alpha$ is the temperature coefficient at 20° C.
$t_A$ is the ambient temperature.

Finally, by substituting equation (4) into the above equation (3) we have:

$$L = \frac{V}{I}\left[\frac{A}{\rho_{20}[1 + \alpha(t_A - 20)]}\right] \qquad (5)$$

where:
the bracketed fraction is equal to the reciprocal of resistivity per cross-sectional area.

The digital I/O circuit portion 12 includes a microprocessor and a read-only memory for storing data representative of the resistivity per unit length of various sizes of wires having a uniform cross-sectional area and for storing programmed instructions. Based upon the stored information, measured voltage and supplied current, the microprocessor can calculate the length of the wire utilizing equation (5) above and the length can then be indicated on the display portion 20.

Figure 2:
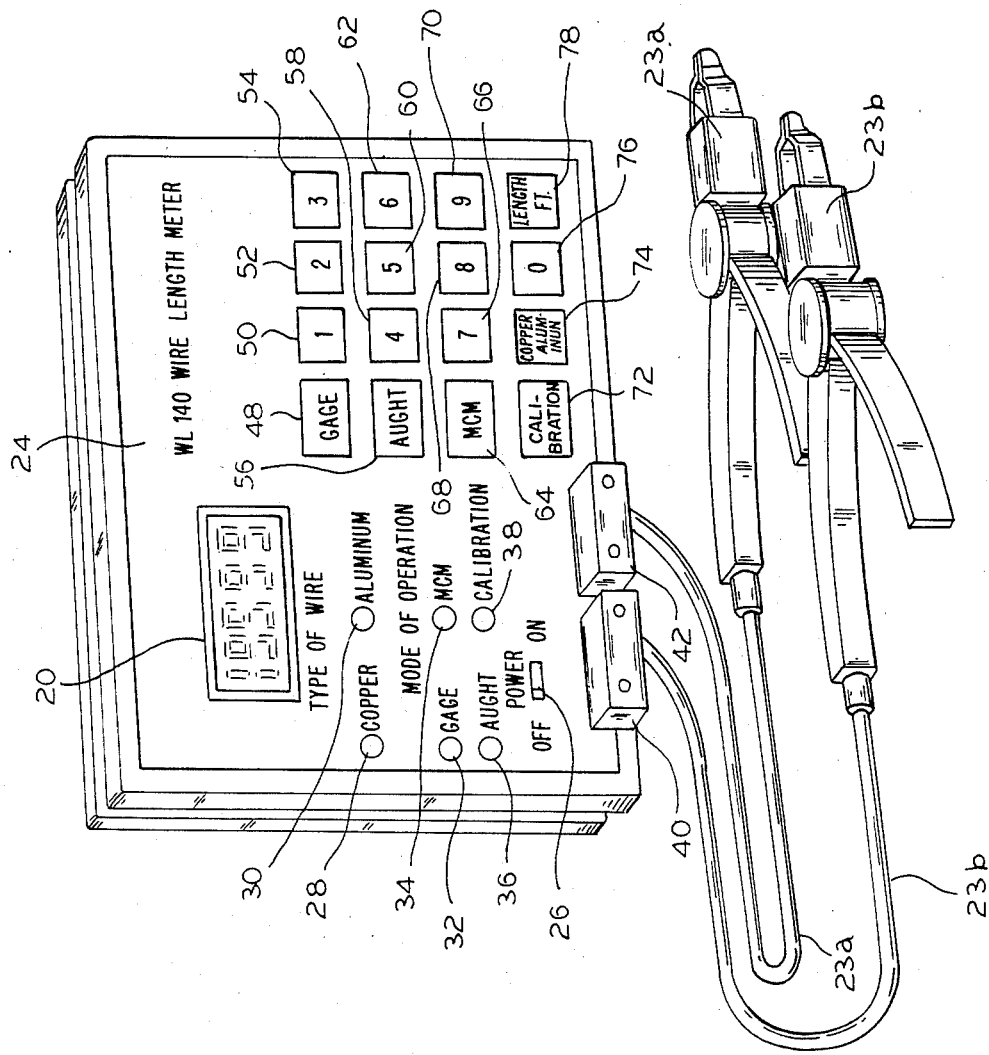
FIG. 2 is a pictorial representation of the front panel of the apparatus for determining the length of wires illustrated in FIG. 1.

To more fully understand the procedure used to determine the length of the wires in the present invention, reference is directed to FIG. 2 which is a pictorial representation of a front panel 24 of the apparatus 10 where an operator interfaces to the digital I/O circuit portion 12 of FIG. 1. The front panel 24 is used to house the keyboard portion 18 and the display portion 20. The panel 24 further includes an on-off power switch 26; six light-emitting diodes (LED) 28, 30, 32, 34, 36, 38; a first connector socket 40; and a second connector socket 42. The first socket 40 receives a plug-in section of the first alligator clip connector assembly 23, the alligator end thereof being attachable to one end of the wire to be tested. Similarly, the second connector socket 42 receives a plug-in section of the second alligator clip connector assembly 23b, the alligator clip end thereof being attachable to the other end of the wire to be tested. The power switch 26 is switched to the "on" position for supplying battery power sources to the apparatus 10. Thus, the apparatus 10 is self-contained and needs no external source of electrical power.

The keyboard portion 18 of the front panel 24 includes a first row of push-button switches 48, 50, 52, 54 which are labeled "GAGE", "1", "2", and "3", respectively. The front panel also includes a second row of push-button switches 56, 58, 60, 62 which are labeled "AUGHT", "4", "5", and "6", respectively. Further, the front panel includes a third row of push-button switches 64, 66, 68, 70 which are labeled "MCM", "7", "8", and "9", respectively. Finally, the front panel includes a fourth row of push-button switches 72, 74, 76, 78 which are labeled "CALIBRATION", "COPPER/ALUMINUM", "0", and "LENGTH (FEET)", respectively.

The LED 28 or 30 will be lit initially when the power switch 26 has been moved to the "on" position so as to indicate the type of wire to be tested. Let's assume that the LED 28 is lit so as to indicate the a "copper" wire is being tested. If the push-button switch 74 is depressed once, the LED 28 will become extinguished and the LED 30 will be lit indicating that the type of wire to be tested is "aluminum." By depressing the push-button switch 74 again, the LED 30 will become extinguished and the LED 28 will be lit again indicating that a "copper" wire is being tested.

The mode of operation is selected by depressing one of the push-button switches 48, 56, 64 or 72. Depending upon the uniform cross-sectional area of the wire or cable to be tested, which is of a standard gauge, one of the switches 48, 50 or 64 is depressed and the corresponding LED 32, 34 or 36 will become lit so as to indicate the kind of wire size. The operator then attaches the alligator clip ends of the connector assemblies 23a, 23b to the respective ends 22a, 22b of the wire 22 to be tested. Next, the push-button switch 78 labeled "LENGTH (FEET)" is depressed. As a result, the display portion 20 will indicate the length of the wire. When the wire or cable to be tested is of a non-standard wire gauge, the push-button switch 72 labeled "CALIBRATION" is depressed so as to place the apparatus 10 in the calibration mode, which enables the determination of the length of any gauge wire as will be explained more fully hereinafter.

Figure 3A:
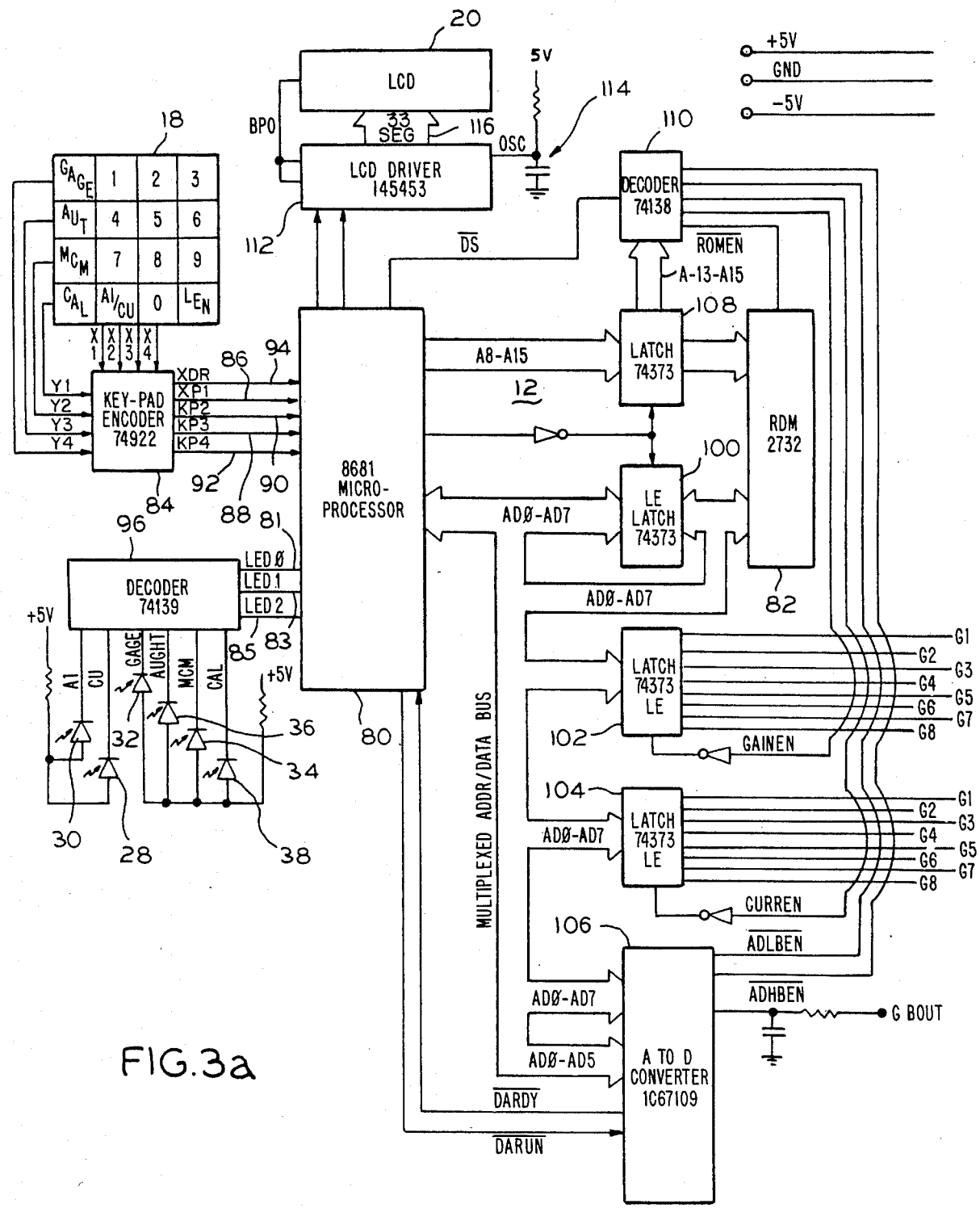
FIGS. 3(a)–3(c), when connected together, is a detailed schematic circuit diagram of the apparatus for determining the length of wires illustrated in FIG. 1.
Figure 3B:
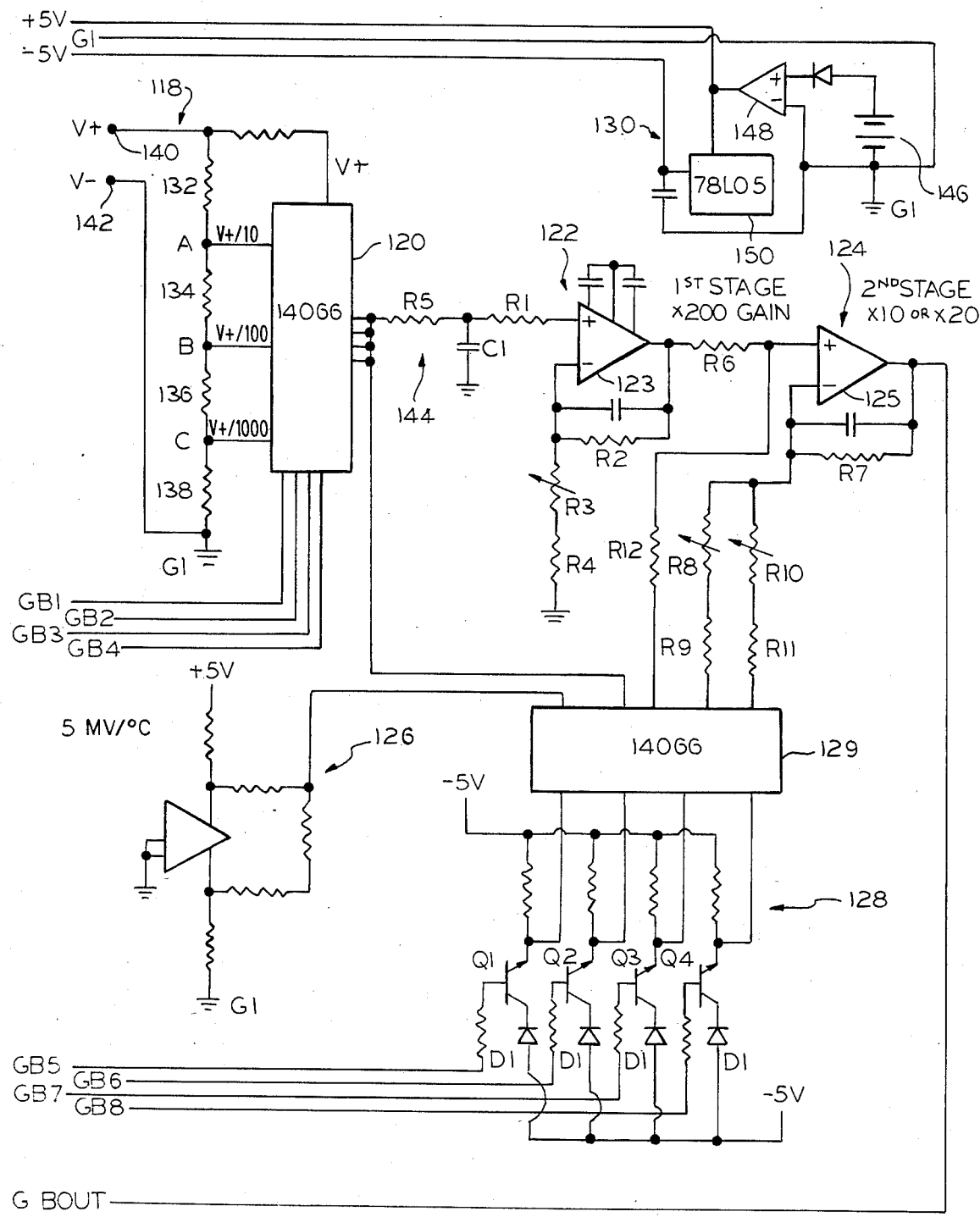
Figure 3C:
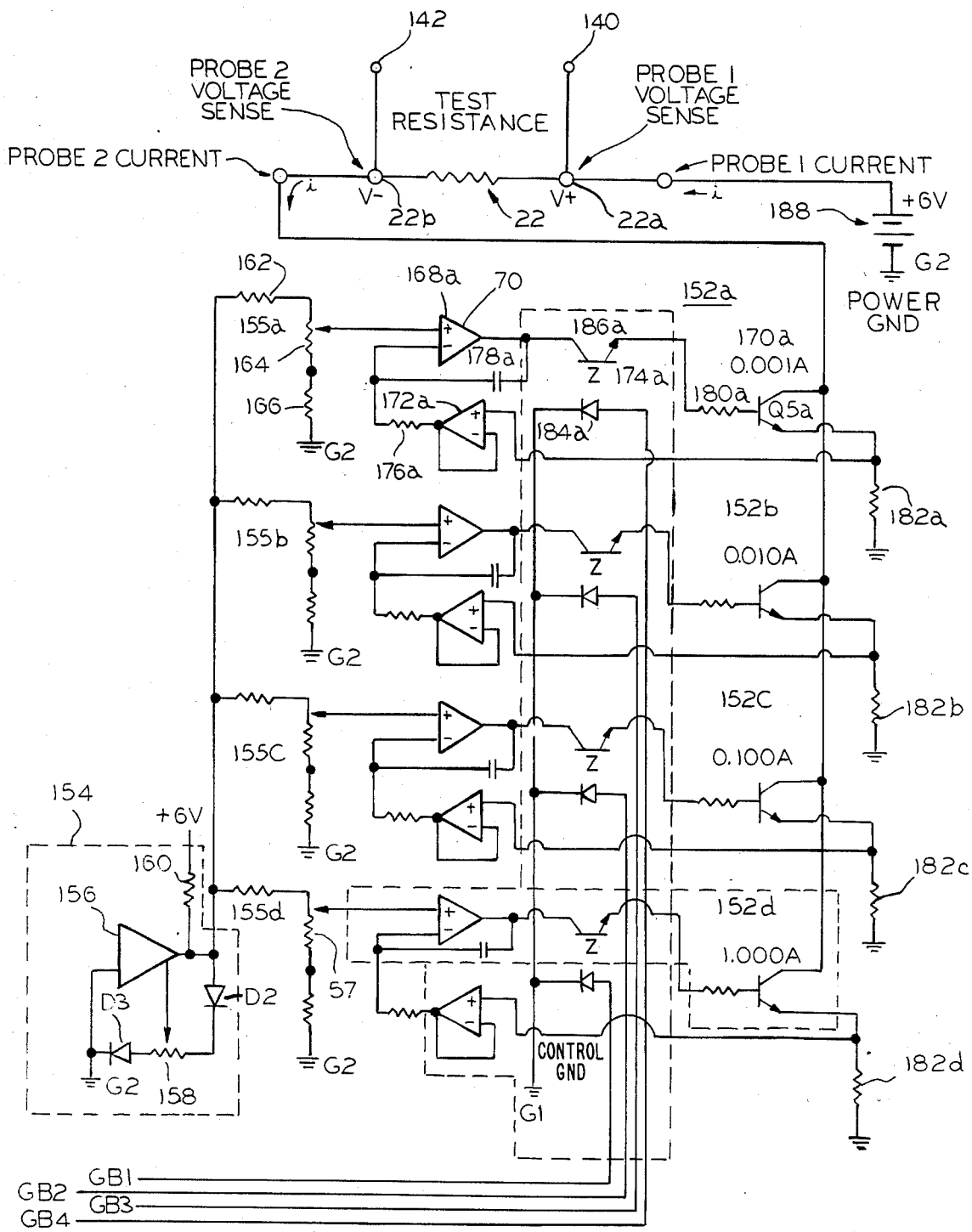

In FIGS. 3(a)-3(c), when connected together, there is illustrated a detailed schematic circuit diagram of the apparatus for determining the length of wires of FIG. 1.

Specifically, in FIG. 3(a) there is shown the digital I/O control circuit portion 12 which is comprised basically of a microprocessor 80 and a read-only memory (ROM) 82 which is used to control the microcomprocessor. The microprocessor 80 is preferably of the type similar to the one commercially available from Zilog of Sunnyvale, Calif., as Model No. Z8681. The ROM 82 is preferably of the type commercially available from Motorola Corporation of Schaumburg, Ill., as Model No. 2732. The ROM 82 is used for storing data representative of the resistivity per unit length of various sizes of wires having a uniform cross-sectional area as well as for storing programmed instructions for controlling the microprocessor 80. The microprocessor 80 inputs all the needed data and outputs all needed control signals to accomplish the measurement operation as set forth herein.

The inputs to the microprocessor 80 is provided by an operator through the 12-key keyboard portion 18 which is connected to a key-pad encoder 84 via eight lines designated X1, . . . X4 and Y1, . . . Y4. The key-pad encoder 84 translates the data on these eight lines into a 4-bit hexadecimal signal (KP1, KP2, KP3, KP4) on respective output lines 86, 88, 90, 92. The encoder 84 further generates a keypad ready signal KPR on output line 94. The microprocessor 80 is used to poll the ready signal KPR and then reads in the hexadecimal signal KP1, . . . KP4 to determine which one of the keys was depressed. From these inputs, the microprocessor 80 generates control signals LED∅, LED1 and LED2 on respective lines 81, 83, 85 which are decoded by a decoder 96. The signals LED∅ on the line 81 is decoded so as to cause the turning on of one of the two LEDs 28, 30 to indicate whether the apparatus 10 is measuring a "copper" or "aluminum" wire. The signals LED1 and LED2 on corresponding lines 83, 85 are decoded so as to turn on one of the four LEDs 32, 34, 36 or 38 to indicate whether the apparatus is in the "GAGE", "AUGHT", "MCM", or "CALIBRATION" mode of operation.

The microprocessor 80 provides further control signals through outputs on multiplexed address/data bus AD∅-AD7, address bus A8-A15, a data run line DARUN, a LCD data line LCDATA, and a LCD clock line LCDCLK. The control signals on the address/data bus AD∅-AD7 are received by latches 100, 102, 104 and an analog-to-digital converter (A/D) 106. The outputs of the latch 100 communicates with the read-only memory ROM 82. The outputs of the latch 102 are used to control the voltage gain circuit portion 16 (FIG. 3(b)) via connections at nodes GB1, . . . GB8. The outputs of the latch 104 are used to control the current source circuit portion 14 (FIG. 3(c)) via connection nodes CB1, . . . CB4. The A/D converter 106 receives an input from the voltage gain circuit portion 16 via connection at node GBOUT and generates an output data ready signal $\overline{DARDY}$ which is fed to the microprocessor 80. A latch 108 receives the address bus A8-A15 and sends the address bus A8-A11 to the ROM 82. The latch 108 also sends the address bus A13-A15 to a decoder 110. The decoder 110 is used to decode the address bus A13-A15 from the output of latch 108 and generates output signals $\overline{ROMEN}$, GAINEN, CURREN, $\overline{ADLBEN}$, and $\overline{ADHBEN}$. These output signals route address and data to the memory mapped elements 82, 102, 104 and 106.

The control signals LCDATA and LCDCLK are used to drive a liquid crystal display of the display portion 20, which is formed of a 7-segment display having five digits, via LCD driver chip 112. A RC circuit 114 is connected to the driver chip 112 for generating a specific oscillator frequency. The driver chip 112 provides thirty-three parallel independent lines, designated by a bus 116, which corresponds to the 7-segments of each of the five digits so as to form the alpha-numerical and decimal point on the liquid crystal display.

The selectable voltage gain circuit portion 16 of FIG. 1 is shown in detail in FIG. 3(b). The voltage gain circuit portion 16 includes a precision voltage divider chain 118, a divider chain selector chip 120, a fixed gain chopper stabilized amplifier 122, a low-offset amplifier 124, an ambient temperature compensation network 1216, a microprocessor interface circuit 128, and a voltage regulator circuit 130.

The voltage divider chain 118 is formed of a series-connection of four resistors 132, 134, 136 and 138. The resistor 132 has its one end connected to an input node 140 for receiving a positive terminal of a first power supply 188 (FIG. 3(c)) and has its other end connected to one end of the resistor 134 at a node A. The input node 140 is also connected to the end 22a of the wire 22 to be tested. The other end of the resistor 134 is connected to one end of the resistor 136 at a node B. The other end of the resistor 136 is connected to one end of the resistor 138 at a node C. The other end of the resistor 138 is connected to an input node 142 which is also connected to a ground potential. The input node 142 is also connected to the other end 22b of the wire to be tested. The voltage cross the ends of the wire to be tested can be measured or sensed across the input nodes 140 and 142 as will be more fully described. The measured voltage across the input nodes 140 and 142 is divided by 10 at the node A, divided by 100 at the node B, and divided by 1,000 at the node C.

The amplifier 122 is formed of an operational amplifier 123, an input resistor R1, a feedback resistor R2, a potentiometer R3, and a resistor R4. The operational amplifier 123 is configured as a non-inverting amplifier with a fixed gain of X200 and provides a maximum output of 2 volts. Thus, the input voltage to the op amp 123 must be scaled down to 10 mV. This scaling is done by the divider chain selector chip 120 which is controlled by the microprocessor 80 via the connections at the nodes GB1, . . . GB4. As a result, the divider ratio at either nodes A, B or C is selected by the microprocessor in order to meet the 10 mV input criteria of the operational amplifier. The output of the divider chain selector chip 120 is fed to the input of the op amp 123 via a low pass filter 144 formed of a resistor R5 and capacitor C1.

The amplifier 124 includes an operational amplifier 125, an input resistor R6, a feedback resistor R7, a potentiometer R8, a resistor R9, a potentiometer R10, a resistor R11, and a resistor R12. The op amp 125 is also configured as a non-inverting amplifier with a selectable gain of X10, X20, or unity gain as controlled by a selector chip 129. When the potentiometer R8 and the resistor R9 are used, the output of the op amp 125 provides a gain of X10. When the potentiometer R10 and the resistor R11 are used, the output of the op amp 125 provides a gain of X20. Finally, when the resistor R12 is used, the output of the op amp 125 has a unity gain.

The microprocessor interface circuit 128 is formed of a level translator circuit which is used to interface between the digital control signals at the node connections GB5 . . . GB8 from the latch 102 and the selector chip 129. The translator circuit 128 includes a plurality of transistors Q1 . . . Q4 whose bases receive the respective digital control signals from the latch 102. Each of the diodes D1 is connected to the collector of a corresponding transistor so as to insure proper turnoff due to the baseemitter voltage drop variations of the transistors and the variations of the digital level of the control signals from the latch 102.

The ambient temperature compensation network 126 is a conventional temperature-to-voltage integrated circuit which is commercially available and provides a 5 mV/°C. output signal. This output signal is fed into the chip selector 129 so as to provide a temperature compensating voltage to be delivered into the op amp 125, as selected by the microprocessor, for amplification either to 50 pk mV/°C. or 100 mV/°C. The output of the op amp 125 provides an analog voltage signal having a predetermined range and is representative of the resistance of the wire being tested. This analog voltage is sent from the node connection GBOUT to the input of the A/D converter 106 (FIG. 3a)).

The voltage regulator circuit 130 is a DC/DC converter which includes a first battery power source 146, an op amp 148, and a voltage regulator 150. The circuit 130 converts the battery source 146, which is typically +9 VDC, to a regulated +5 volts and −5 volts for use by all of the circuits except for the ones in the current source circuit 14.

The current source circuit 14 of FIG. 1 is illustrated in detail in FIG. 3(c). The current source circuit 14 includes four current loop sections 152a, 152b, 152c, 152d which are used to selectively pass specific different values of current from end 22a of the wire 22 to be tested to the other end 22b thereof. The current source circuit 14 further includes a reference generator 154 and four divider chains 155a, 155b, 155c, 155d. The reference generator 154 is formed of an op amp 156; diodes D2, D3; a potentiometer 158; and a resistors 160. A stable reference voltage of +2.5 volts is generated at the output of the op amp 156. Each of the divider chains 155a–155d include a first resistor 162, a potentiometer 164, and a second resistor 166. One end of the resistors 162 is connected to the reference voltage of +2.5 volts and the other end of the resistor 162 is connected to one side of the potentiometer 164. The other side of the potentiometer 164 is connected to one end of the resistor 166. The other end of the resistor 166 is connected to the ground potential. The outputs of the divider chains are at the wiper arms of the potentiometers 164 which are set to be approximately 0.6 volts.

The current loop sections 152a includes an operational amplifier 168a, a voltage-to-current converter 170a, a feedback op amp 172a, and an opto-isolator 174a. The op amp 168a has its non-inverting input connected to the wiper arm of the potentiometer 164 of the divider chain 155a for receiving the 0.6 volts, its inverting input connected to the output of the feedback op amp 172a via a resistor 176a. The output of the op amp 168a is also connected to its inverting input via a capacitor 178a.

The voltage-to-current converter 170a is formed of a transistor Q5a, a base resistor 180a, and an emitter feedback resistor 182a. The opto-isolator 174a includes a light-emitting diode 184a and a photo-transistor 186a. The light-emitting diode 184a has its anode connected to the node connection CB1 for receiving a control signal from the latch 104 and its cathode connected to the ground potential. The photo-transistor 186a has its collector connected to the output of the op amp 168a and its emitter connected to the base resistor 180a. When the control signal at the node CB1 is activated, the light-emitting diode will conduct so as to turn on the photo-transistor 186a. As a result, the output of the op amp 168a will be coupled to the base of the transistor Q5a. The transistor Q5a has its collector connected to the input node 142 (the wire end 22b) and its emitter connected to one end of the emitter resistor 182a and to the non-inverting input of the feedback op amp 172a. The other end of the emitter resistor 182a is connected to the ground potential.

The current loop sections 152b, 152c and 152d have identical components and their interconnections are the same as just described with respect to the current loop section 152a and thus will not be repeated. As can be seen, like components in current loop sections 152b, 152c, 152d have been designated with the same reference numerals as the current loop section 152a followed by the corresponding letter "b", "c", or "d." It should be noted that the actual value of the emitter resistors 182a . . . 182d are different. In particular, a 0.6 volts will be developed across the corresponding emitter resistors 182a, 182b, 182c, 182d when a corresponding current of 0.001, 0.01, 0.1 and 1 ampere flows therethrough.

A second battery power source 188, which is typically +6 volts, is used to supply the different currents through the wire sample. As previously pointed out, the positive terminal of the second power source 188 is connected to the input node 140 (the wire end 22a) for supplying the current. The opto-isolators 174a . . . 174d serve to isolate the second power source 188 from the first power source 146 which is to operate all of the other circuits in the apparatus 10.

For completeness in the disclosure of the above-described apparatus, but not for purposes of limitation, the following representative values and component identifications used in the circuitry of FIG. 3(a)–3(c) are submitted. These values and components were employed in an apparatus that was constructed and tested and which provides high quality performance. Those skilled in this art will recognize that many alternative elements and values may be employed in constructing apparatuses and circuits in accordance with the present invention.

| PART | TYPE OR VALUE |
| --- | --- |
| MP 80 | 8681, Zilog |
| ROM 82 | 2732, Motorola |
| Latch 100, 102, 104, 108 | 74373, Motorola |
| LCD Driver 112 | 145453, Motorola |
| Encoder 84 | 74922, Motorola |
| Decoder 96 | 47139 |
| Decoder 110 | 74138 |
| A/D converter 106 | ICL7109 |
| Selector Chip 120, 129 | 14066 |
| Temp.compensation network 129 | |
| Op Amp 123, 125 | 741 |
| Transistors Q1–Q4 | 2N3906 |
| Diodes D1, D2, D3 | IN914 |
| Op Amp 168a-d, 172a–d | LM324 |
| Transistors Q5a–Q5d | |
| Opto-isolators 174a–174d | |
| Voltage regulator | 78L05 |

Figure 4:
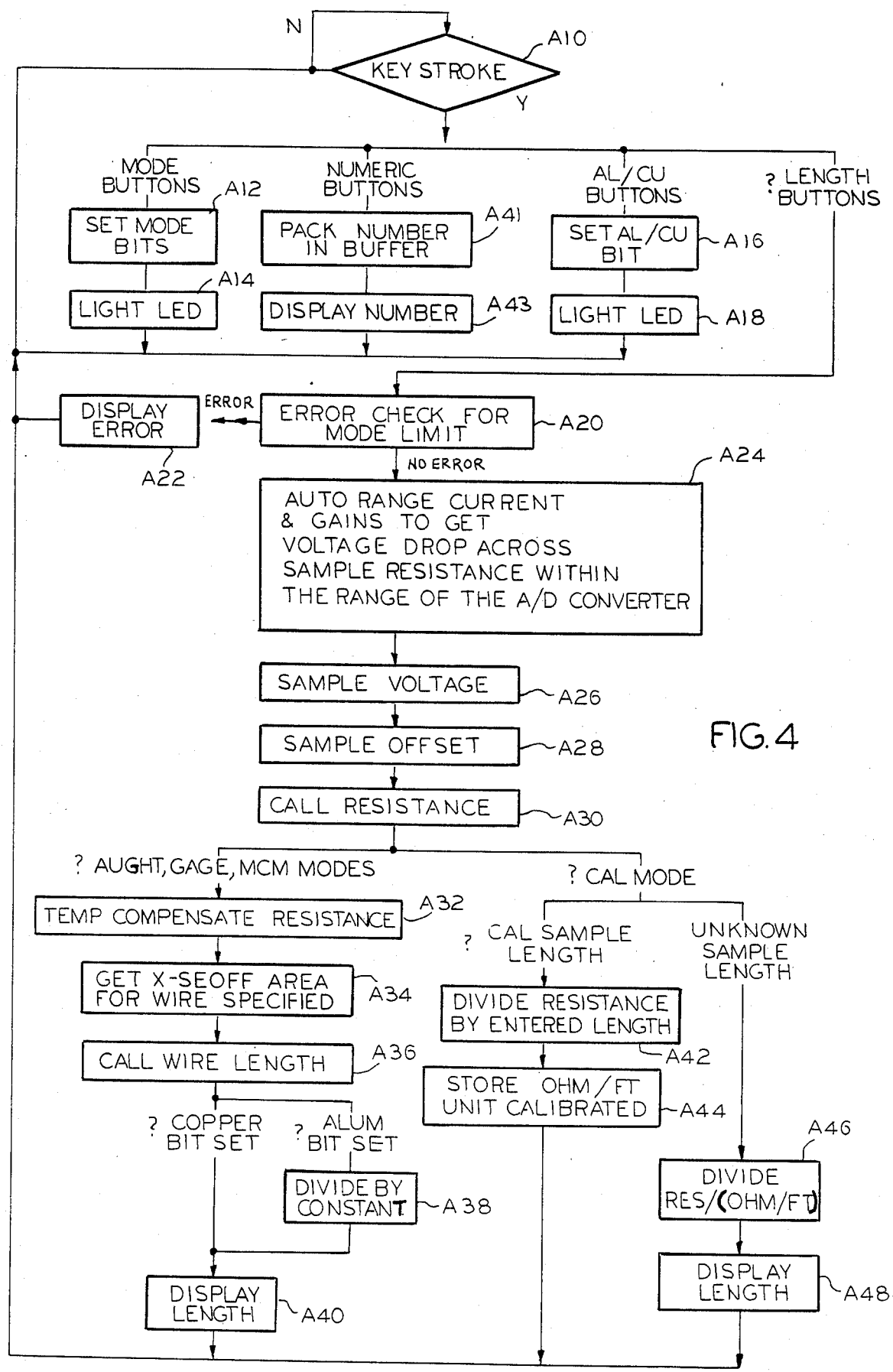
FIG. 4 is a detailed flow chart of the program stored within the microprocessor and read-only memory illustrated in FIG. 3(a).

FIGS. 3(a)–3(c) and FIG. 4 will now be referenced to more fully describe the operation of the microprocessor 80 during a test measurement of a wire or cable. FIG. 4 is a detailed flow chart of the program stored in the microprocessor 80 and in the ROM 82 and how it is interfaced with the keyboard portion 18 and the display portion 20 so as to operate the apparatus 10. Initially, the power switch is turned on so as to actative the keypad shown in block A10. Then the operator selects the "GAGE", "AUGHT", "MCM", or "CALIBRATION" mode of operation by depressing one of the push-button switches 24, 56, 64 or 72. The microprocessor 80 will generate the control signals from block A12 to light up one of the corresponding LEDs in block A14 indicating the mode of operation selected. Next, the operator selects either the "ALUMINUM" or "COPPER" mode by depressing the switch 76. The microprocessor will then generate a control signal from block A16 to light up one of the LEDs in block A18 indicating the type of wire selected. One of the alligator clip assemblies 23a is connected to one end 22a of the wire 22 to be measured, and the other one of the alligator clip assemblies 23b is connected to the other end 22b of the wire 22.

The operator will then depress the push-button 78 labeled "LENGTH (FEET)". The microprocessor will initially check for an error for the mode limit in block A20. If there is an error, it will be displayed from block A22. If no error exists, the microprocessor will begin processing under the control of the stored program in the ROM 82. In block A24, the microprocessor will selectively supply different values of currents from the current source circuit portion 14 and selectively measure the voltages from the voltage gain circuit portion 16 so as to obtain a voltage drop across the wire sample 22 to be within the range of the A/D converter 106. In blocks A26, A28, A30 the voltage and offset are sampled and then a resistance of the wire is calculated.

If the "GAGE", "AUGHT", or "MCM" mode has been selected, the calculated resistance in block A30 is temperature compensated for in block A32. Data representative of resistivity per unit length of various sizes of wires having a uniform cross-sectional area is stored in the ROM 82. In block A34, the appropriate value of resistivity per unit length is retrieved from the ROM 82 for the type of gauge wire selected. In block A36, the calculated resistance of the wire in block A30 is divided by the value obtained in block A34 so as to calculate the length in feet. If the "COPPER" mode is selected, this value is displayed in block A40. If the "ALUMINUM" mode is selected, the value in block A36 is divided by a constant in block A38 prior to being displayed in the block A40.

On the other hand, if the "CALIBRATION" mode is selected, the resistivity per unit length of the unknown sample wire must first be computed since the cross-sectional area of the wire is not known. Thus, the resistivity per unit length has not been previously stored in the ROM 82. Accordingly, when the switch 72 is depressed, the display portion 20 will show a reading of "CSL" which refers to Calibrate Sample Length. A specific length of the unknown sample wire must be cut from the reel, whose ends are connected to the clip assemblies. The operator must then use the push-button switches labeled "0" to "9" so as to enter the corresponding specific length of the unknown wire sample from 10 feet to 100 feet. The number entered will be displayed via blocks A41 and A43. Then, the microprocessor in block A42 will divide the resistance of the wire calculated from the block A30 by the length entered in block A44 so as to compute the resistance per foot. The microprocessor will cause this value to be stored in block A46. The entire reel of the unknown wire is next connected to the clip assemblies and the total resistance is obtained from the block A30 and is divided by the stored value in the block A44. This is calculated in block A46 and finally, the length is displayed in the block A48.

From the foregoing detailed description, it can thus be seen that the present invention provides a method and apparatus for determining the length of a wire wound on the reel on an effective and efficient basis. The wire length meter of the present invention is formed of a selectable current source circuit, a selectable voltage gain circuit, and analog-to-digital converter, a read-only memory, a digital processor, and a display portion.

While there has been illustrated and described what is at present considered to be a preferred embodiment of the present invention, it will be understood by those skilled in the art that various changes and modifications may be made, and equivalents may be substituted for elements thereof without departing from the true scope of the invention. In addition, many modifications may be made to adapt a particular situation or material to the teachings of the invention without departing from the central scope thereof. Therefore, it is intended that this invention not be limited to the particular embodiment disclosed as the best mode contemplated for carrying out the invention, but that the invention will include all embodiments falling within the scope of the appended claims.

What is claimed is:

1. An apparatus for determining the length of wires, said apparatus comprising:
   connecting means for connecting across the ends of the wire whose length is to be determined;
   current source means for selectively supplying different values of currents through the wire whose length is to be determined;
   voltage gain means responsive to said different values of currents for selectively generating a plurality of different voltage levels for each of said different values of currents so as to provide an analog voltage signal having a predetermined range;
   analog-to-digital converting means responsive to said analog voltage signal for converting the same to a first digital signal corresponding to a resistance of the wire;
   storage means for storing data representative of resistance per unit length of various sizes of wires having a uniform cross-sectional area and for storing programmed instructions;
   digital data processing means being responsive to the programmed instructions stored in said storage means for controlling the operation of said current source means, voltage gain means, and analog-to-digital converting means so as to generate said first digital signal;
   said data processing means utilizing said first digital signal corresponding to the resistance of the wire and the data representative of resistance per unit length for generating a second digital signal representative of the length of the wire; and
   display means responsive to said second digital signal for indicating the wire length.

2. An apparatus as claimed in claim 1, wherein said current source means comprises a plurality of current loop circuit sections for supplying the different values of currents through the wire, each current loop section including a first operational amplifier having a non-inverting input, an inverting input and an output, an opto-isolator, a transistor, a feedback resistor, and a second feedback operational amplifier having a non-inverting input and an output, said first operational amplifier having its non-inverting input coupled to a reference voltage and its inverting input coupled to the output of said second feedback operational amplifier, said opto-isolator being coupled between the output of said first operational amplifier and the base of said transistor, the collector of said transistor being coupled to one end of the wire, the emitter of said transistor being coupled to the non-inverting input of said second feedback operational amplifier and to one end of said feedback resistor, the other end of said feedback resistor being connected to a ground potential.

3. An apparatus as claimed in claim 2, wherein said current source means further includes a stable reference generator and a plurality of divider networks connected to the reference generator to provide reference voltages connectible to the corresponding non-inverting inputs of said first operational amplifier.

4. An apparatus as claimed in claim 3, wherein said opto-isolator is formed of a light-emitting diode and a photo-transistor.

5. An apparatus as claimed in claim 1, wherein said voltage gain means comprises divider chain selector means responsive to said different values of currents from said current source means and control signals from said data processing means for generating a selected voltage.

6. An apparatus as claimed in claim 5, wherein said voltage gain means further comprises amplifying means for selectively amplifying the selected voltage by a selectable amount to provide the analog voltage signal to be within the predetermined range.

7. An apparatus as claimed in claim 6, further comprising a temperature compensation network coupled to said amplifying means for modifying the amplified voltage as a function of ambient temperature.

8. An apparatus as claimed in claim 7, wherein said voltage gain means further comprises interface circuit means for interfacing second control signals from said data processing means with said amplifying means so as to accommodate for the variations of the digital level of said second control signals.

9. An apparatus as claimed in claim 1, wherein said storage means comprises a read-only memory.

10. An apparatus as claimed in claim 1, wherein said data processing means comprises a microprocessor, a first latch controlled by said microprocessor to generate said first control signals to said current source means, and a second latch controlled by said microprocessor to generate said second control signals and third control signals to said voltage gain means.

11. An apparatus as claimed in claim 1, wherein said display means comprises a LCD driver circuit and a five-digit, seven-segment liquid crystal display whose inputs are connected to the outputs at said driver circuit, said driver circuit having its input connected to receive control signals from said data processing means.

12. An apparatus for measuring and displaying the length of a wire, said apparatus comprising:
connecting means for connecting across the ends of the wire whose length is to be determined;
current source means for selectively supplying different values of currents through the wire whose length is to be determined;
voltage gain means responsive to said different values of currents for selectively generating a plurality of different voltage levels for each of said different values of currents so as to provides an analog voltage signal having a predetermined range;
analog-to-digital converting means responsive to said analog voltage signal for converting the same to a first digital signal corresponding to a resistance of the wire;
digital input/output control means responsive to said first digital signal and including a microprocessor and a read-only memory having stored programmed instructions and stored data representative of resistance per unit area of various sizes of wires having a uniform cross-sectional area for generating a second digital signal representative of the length of the wire; and
display means responsive to said second digital signal for indicating the wire length.

13. An apparatus as claimed in claim 12, further comprising calibration means for measuring and displaying the length of non-standard gauge wires.

14. An apparatus as claimed in claim 13, wherein said current source means comprises a plurality of current loop circuit sections for supplying the different values of current through the wire, each current loop section including a first operational amplifier having a non-inverting input, an inverting input and an output, an opto-isolator, a transistor, a feedback resistor, and a second feedback operational amplifier having a non-inverting input and an output said first operational amplifier having its non-inverting input coupled to a reference voltage and its inverting input coupled to the output of said second feedback operational amplifier, said opto-isolator being coupled between the output of said first operational amplifier and the base of said transistor, the collector of said transistor being coupled to one end of the wire, the emitter of said transistor being coupled to the non-inverting input of said second feedback operational amplifier and to one end of said feedback resistor, the other end of said feedback resistor being connected to a ground potential.

15. An apparatus as claimed in claim 14, wherein said current source means further includes a stable reference generator and a plurality of divider networks connected to the reference generator to provide reference voltages connectible to the corresponding non-inverting inputs of said first operational amplifier.

16. An apparatus as claimed in claim 15, wherein said voltage gain means comprises divider chain selector means responsive to said different values of currents from said current source means and control signals from said digital input/output control means for generating a selected voltage.

17. An apparatus as claimed in claim 16, wherein said voltage gain means further comprises amplifying means for selectively amplifying the selected voltage by a selectable amount to provide the analog voltage signal to be within the predetermined range.

18. An apparatus as claimed in claim 17, further comprising a temperature compensation network coupled to said amplifying means for modifying the amplified voltage as a function of ambient temperature.

19. An apparatus as claimed in claim 18, wherein said voltage gain means further comprises interface circuit means for interfacing second control signals from said digital input/output control means with said amplifying means so as to accommodate for the variations of the digital level of said second control signals.

20. A method for measuring and indicating the length of wires, said method comprising the steps of:
    selectively supplying different values of currents through the wire whose length is to be determined;
    selectively measuring a plurality of different voltage levels for each of the different values of currents so as to provide an analog voltage signal having a predetermined range;
    converting the analog voltage signal to a first digital signal corresponding to a resistance of the wire;
    storing data representative of resistance per unit area of various sizes of wire having a uniform cross-sectional area;
    generating a second digital signal representative of the length of the wire in response to the first digital signal and the stored data; and
    displaying the wire length in response to the second digital signal.

* * * * *